(12) United States Patent
Sato et al.

(10) Patent No.: US 10,705,151 B2
(45) Date of Patent: Jul. 7, 2020

(54) INTERMEDIATE STRUCTURE UNIT FOR SECONDARY CELL AND METHOD FOR MANUFACTURING SECONDARY CELL

(71) Applicant: KABUSHIKI KAISHA NIHON MICRONICS, Tokyo (JP)

(72) Inventors: Yuki Sato, Tokyo (JP); Kazuyuki Tsunokuni, Tokyo (JP); Tomokazu Saito, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 193 days.

(21) Appl. No.: 15/745,652

(22) PCT Filed: Jun. 23, 2016

(86) PCT No.: PCT/JP2016/003027
§ 371 (c)(1),
(2) Date: Jan. 17, 2018

(87) PCT Pub. No.: WO2017/013836
PCT Pub. Date: Jan. 26, 2017

(65) Prior Publication Data
US 2018/0210033 A1 Jul. 26, 2018

(30) Foreign Application Priority Data
Jul. 22, 2015 (JP) .................... 2015-144556

(51) Int. Cl.
*G01R 31/26* (2020.01)
*G01R 31/36* (2020.01)
(Continued)

(52) U.S. Cl.
CPC ....... *G01R 31/388* (2019.01); *G01R 31/3865* (2019.01); *H01G 9/2068* (2013.01);
(Continued)

(58) Field of Classification Search
CPC ........ G01R 31/26; G01R 31/36; G01R 1/067; H01M 10/42; H01M 10/48; H01M 4/131; H01L 29/792; H01L 21/336
See application file for complete search history.

(56) References Cited

U.S. PATENT DOCUMENTS 4,084,043 A * 4/1978 Witzke ............... H01G 9/20
429/111
2009/0104342 A1 4/2009 Wang et al.
(Continued)

FOREIGN PATENT DOCUMENTS

JP S6242573 A 2/1987
JP 2009105402 A 5/2009
(Continued)

OTHER PUBLICATIONS

ISA Japan Patent Office, International Search Report Issued in Application No. PCT/JP2016/003027, dated Sep. 13, 2016, WIPO, 2 pages.
(Continued)

*Primary Examiner* — Neel D Shah
(74) *Attorney, Agent, or Firm* — McCoy Russell LLP

(57) ABSTRACT

An intermediate structure unit for a secondary cell according to the present invention is the intermediate structure unit for a secondary cell having a secondary cell and a test structure unit on a common substrate. Each of the secondary cell and the test structure unit includes a first electrode layer and a second electrode layer. A plurality of layers are layered at the secondary cell between the first electrode layer and the second electrode layer. The plurality of layers include at least a metal oxide semiconductor layer and a charging layer. A party of the plurality of layers is formed at the test structure unit between the first electrode layer and the second electrode layer.

15 Claims, 7 Drawing Sheets

(51) Int. Cl.
  *H01M 10/00* (2006.01)
  *H01M 4/131* (2010.01)
  *H01L 29/792* (2006.01)
  *H01L 21/336* (2006.01)
  *G01R 31/388* (2019.01)
  *G01R 31/385* (2019.01)
  *H01M 10/48* (2006.01)
  *H01G 9/20* (2006.01)
  *H01M 14/00* (2006.01)
  *H01M 10/42* (2006.01)

(52) U.S. Cl.
  CPC ....... *H01M 10/4285* (2013.01); *H01M 10/48* (2013.01); *H01M 14/005* (2013.01)

(56) References Cited

U.S. PATENT DOCUMENTS

| | | |
|---|---|---|
| 2010/0067089 A1 | 3/2010 | Nakazawa |
| 2011/0175157 A1* | 7/2011 | Sekine .............. H01L 27/11578 257/324 |
| 2013/0224596 A1* | 8/2013 | Nakazawa ............ H01M 4/131 429/220 |
| 2014/0320108 A1 | 10/2014 | Dewa et al. |
| 2014/0327445 A1* | 11/2014 | Dewa .................... H01M 10/48 324/437 |
| 2015/0192611 A1 | 7/2015 | Dewa et al. |

FOREIGN PATENT DOCUMENTS

| | | |
|---|---|---|
| JP | WO2013035149 A1 | 3/2015 |
| WO | 2008053561 A1 | 5/2008 |
| WO | 2012035149 A1 | 3/2012 |
| WO | 2013065094 A1 | 5/2013 |

OTHER PUBLICATIONS

European Patent Office, Extended European Search Report Issued in Application No. 16827404.1, dated Mar. 4, 2019, Germany, 6 pages.

* cited by examiner

INTERMEDIATE STRUCTURE UNIT FOR SECONDARY CELL AND METHOD FOR MANUFACTURING SECONDARY CELL

CROSS-REFERENCE TO RELATED APPLICATIONS

The present application is a U.S. National Phase of International Patent Application Serial No. PCT/JP2016/003027, entitled "SECONDARY BATTERY INTERMEDIATE STRUCTURE AND METHOD FOR MANUFACTURING SECONDARY BATTERY," filed on Jun. 23, 2016. International Patent Application Serial No. PCT/JP2016/003027 claims priority to Japanese Patent Application No. 2015-144556 filed on Jul. 22, 2015. The entire contents of each above-cited applications are hereby incorporated by reference in their entirety for all purposes.

TECHNICAL FIELD

The present invention relates to an intermediate structure unit for a cell capable of repeatedly performing charging-discharging (also called a secondary cell in the present specification) and a method for manufacturing a secondary cell.

BACKGROUND ART

Patent Documents 1, 2 discloses a quantum cell that is an all-solid-state physical secondary cell. The quantum cell disclosed in Patent Documents 1, 2 has a structure, for example, that a first electrode, a charging layer, a p-type metal oxide semiconductor layer, and a second electrode are layered on a substrate. The charging layer is a layer capable of capturing electrons obtained through photoexcited structural change caused on a particle-like n-type metal oxide semiconductor that is covered with an insulating material.

In Patent Documents 1, 2, electrical characteristics of a cell are to be measured. In Patent Document 1, electrical characteristic values are measured by an electrode probe being contacted to a measurement position on an external surface of at least one of a positive electrode and a negative electrode. For example, a voltage source and a current source are arranged to be selectively connectable to the electrode probe and a voltage meter is connected thereto. Charging-discharging characteristics and the like are evaluated based on measured voltage with the voltage meter, charging-discharging time, and the like during charging-discharging and at the time of fully-charged. In this manner, determining quality of a cell and specifying a failure position are performed.

An evaluation apparatus of Patent Document 2 evaluates characteristics of a charging layer of a cell while contacting a semiconductor probe to a charging layer of a quantum cell during manufacturing. Specifically, similarly to a quantum cell, a semiconductor probe in which a metal oxide semiconductor layer and an electrode layer are layered is prepared. Then, the semiconductor probe is intimately contacted to the charging layer of the quantum cell during manufacturing after the charging layer is layered. According to the above, the quantum cell during manufacturing becomes operable as a cell. Accordingly, it is possible to evaluate electrical characteristics of the charging layer of the quantum cell during manufacturing.

CITATION LIST

Patent Literature

Patent Document 1: International Patent Publication WO2012/035149
Patent Document 2: International Patent Publication WO2013/065094
Patent Document 3: Japanese Unexamined Patent Application Publication 2009-105402

SUMMARY OF INVENTION

Technical Problem

It has been desired, for such a quantum cell, to perform a variety of kinds of evaluation and measurement on a various functional layers such as an electrode layer, a metal oxide semiconductor layer, and a charging layer. For example, if characteristics of each layer can be evaluated, manufacturing processes, characteristics of each layer, and the like can be improved. That is, at the time when a failure occurs at a manufactured cell, a layer that has caused the failure and a manufacturing process that has caused the failure can be easily specified. Consequently, characteristics of each layer can be improved and quality can be stabilized. The above contributes to improvement of characteristic, productivity, and the like of cells.

However, with an evaluation method disclosed in Patent Document 1, electrical characteristics are measured for a completed cell. Accordingly, there may be a case that a functional layer or a manufacturing process in trouble is difficult to be accurately specified. Further, there may be a case that a cell is required to be broken and analyzed for specifying a cause. With an evaluation method disclosed in Patent Document 2, it is possible to evaluate a charging layer, an electrode layer, and the like during manufacturing a cell. However, it is difficult to be operative when a failure occurs at the layers as a consequence of a subsequent manufacturing process.

Patent Document 3 discloses a process determination vehicle (PDV) for a solar cell not for a secondary cell. In Patent Document 3, a TCO film, a silicon absorption layer, and a rear contact layer (conductive layer) are layered on a glass substrate. Thereafter, an evaluation unit is formed on the same substrate as a PV cell as arranging a groove (separation groove) by eliminating the layers.

The evaluation unit is arranged so that electrical resistance of the rear contact layer can be measured as connecting a voltage source and a voltage measuring unit to between two positions on the rear contact layer. Further, it also discloses an evaluation unit that can measure electrical resistance of the TCO film as arranging a contact region between the rear contact layer and the TCO film and an evaluation unit that can measure electrical resistance of a TCO-Si phase boundary as arranging a TCO-Si phase boundary region.

According to the method of Patent Document 3, the resistance is measured by measuring voltage drop between the two positions on a surface of the rear contact layer. Therefore, it is required to perform processing (groove forming and layering thereafter) for forming a measurement path connecting the two positions at the evaluation unit. However, such processing is not required for a solar cell region. Accordingly, there has been a problem that measurement results of the evaluation unit do not always reflect layer characteristics of the solar cell region.

For example, there may be a case that the contact region between the rear contact layer and the TCO film arranged at the evaluation unit influences the measurement results of the measurement path. Further, owing to that the TCO-Si phase boundary that is newly formed on the path of the evaluation unit structurally differs from a phase boundary of a cell region and that the processing itself influences thereto, the measurement results of the evaluation unit do not always reflect characteristics values of the TCO-Si phase boundary of the solar cell.

In a quantum cell, as disclosed in Patent Document 2, the charging layer and one or more metal oxide semiconductor layers are formed as being layered between the first electrode and the second electrode. A forming method for the charging layer is extremely different from that for the metal oxide semiconductor layer. Accordingly, if it is possible to determine which layer has a failure, a manufacturing process can be appropriately improved. If the semiconductor layer and the charging layer can be appropriately evaluated, productivity can be improved.

In view of the abovementioned problems, an object of the present invention is to provide an intermediate structure unit for a secondary cell and a method for manufacturing a secondary cell enabling to perform appropriate evaluation.

Solution to Problem

An intermediate structure unit for a secondary cell according to an aspect of the present invention includes one or more secondary cells and one or more test structure units, arranged on a common substrate. Here, each of the secondary cell and the test structure unit includes a first electrode layer and a second electrode layer, the first electrode layers are formed in an integrated pattern for the secondary cell and the test structure unit, the second electrode layers are separated between the secondary cell and the test structure unit, a plurality of layers are layered at the secondary cell between the first electrode layer and the second electrode layer, the plurality of layers include at least a metal oxide semiconductor layer and a charging layer, and a part of the plurality of layers is formed at the test structure unit between the first electrode layer and the second electrode layer. According to the above, evaluation on each layer can be performed more accurately.

In the abovementioned intermediate structure unit for a secondary cell, a plurality of the test structure units may be included and the second electrode layers may be separated between the test structure units.

In the abovementioned intermediate structure unit for a secondary cell, the plurality of test structure units may include a test structure unit in which the charging layer is not formed between the first electrode layer and the second electrode layer. Accordingly, characteristics of the charging layer can be appropriately evaluated.

In the abovementioned intermediate structure unit for a secondary cell, the plurality of test structure units may include a test structure unit in which the charging layer between the first electrode layer and the second electrode layer is in contact with at least one of the first electrode layer and the second electrode layer.

In the abovementioned intermediate structure unit for a secondary cell, the second electrode layers of the plurality of test structure units are equally shaped in a plane view.

In the abovementioned intermediate structure unit for a secondary cell, some units of the plurality of the test structure units may be arranged as being adjacent to a single secondary cell.

In the abovementioned intermediate structure unit for a secondary cell, the plurality of test structure units may include test structure units, layer structures of which, each arranged between the first electrode layer and the second electrode layer, are different from each other. Accordingly, characteristics of the plurality of layers can be appropriately evaluated.

In the abovementioned intermediate structure unit for a secondary cell, the secondary cell may have a layer structure layered between the first electrode layer and the second electrode layer, the layer structure being a two-layer structure having the metal oxide semiconductor layer and the charging layer; and the plurality of test structure units may include a test structure unit in which the charging layer is arranged between the first electrode layer and the second electrode layer, and a test structure unit in which the metal oxide semiconductor layer is arranged between the first electrode layer and the second electrode layer.

In the abovementioned intermediate structure unit for a secondary cell, the metal oxide semiconductor layer may include a first metal oxide semiconductor layer and a second metal oxide semiconductor layer that are different from each other; the first metal oxide semiconductor layer, the charging layer, and the second metal oxide semiconductor layer may be arranged at the secondary cell between the first electrode layer and the second electrode layer; and the plurality of test structure units may include a test structure unit in which the first metal oxide semiconductor layer and the charging layer are arranged between the first electrode layer and the second electrode layer, a test structure unit in which the charging layer and the second metal oxide semiconductor layer are arranged between the first electrode layer and the second electrode layer, a test structure unit in which the charging layer is arranged between the first electrode layer and the second electrode layer, a test structure unit in which the first metal oxide semiconductor layer and the second metal oxide semiconductor layer are arranged between the first electrode layer and the second electrode layer, a test structure unit in which the first metal oxide semiconductor layer is arranged between the first electrode layer and the second electrode layer, and a test structure unit in which the second metal oxide semiconductor layer is arranged between the first electrode layer and the second electrode layer.

In the abovementioned intermediate structure unit for a secondary cell, the secondary cell and the test structure unit may be arranged on both faces of the substrate.

In the abovementioned intermediate structure unit for a secondary cell, the test structure units may further include a test structure unit in which the same layer structure as a layer structure layered at the secondary cell between the first electrode layer and the second electrode layer is formed between the first electrode layer and the second electrode layer. Accordingly, performance of the cell can be evaluated more appropriately.

In the abovementioned intermediate structure unit for a secondary cell, the substrate may be conductive and double with the first electrode layer.

A method for manufacturing a secondary cell according to an aspect of the present invention may include preparing the abovementioned intermediate structure unit for a secondary cell and measuring electrical characteristics of the test structure unit. Accordingly, characteristics of layers can be appropriately evaluated.

In the abovementioned method for manufacturing a secondary cell, it is also possible to further include evaluating performance of the secondary cell arranged in the intermediate structure unit for the secondary cell, and the measuring electrical characteristics of the test structure unit may be performed in a case that the performance of the secondary cell does not satisfy predetermined criteria.

In the abovementioned method for manufacturing a secondary cell, it is also possible to further include separating the test structure unit from the secondary cell in a case that the performance of the secondary cell satisfies the predetermined criteria. Accordingly, high-performance cells can be manufactured with high productivity.

The present invention includes a secondary cell in which a first electrode layer, a first conductive semiconductor layer, a charging layer, a second conductive semiconductor layer, and a second electrode layer are layered; and a test structure unit in which one or two layers out of three layers being the first conductive semiconductor layer, the charging layer, and the second conductive semiconductor layer are formed between the first electrode layer and the second electrode layer. According to the above, characteristics of the layers can be appropriately evaluated.

In the abovementioned intermediate structure unit for a secondary cell, the charging layer may not be arranged in the test structure unit. According to the above structure, measurement of the first conductive semiconductor layer and the second conductive semiconductor layer can be appropriately evaluated. Alternatively, in the test structure unit, the charging layer may be in contact with at least one of the first electrode layer and the second electrode layer. According to the above, characteristics of the charging layer can be appropriately evaluated.

In the abovementioned intermediate structure unit for a secondary cell, a plurality of the test structure units may be included and the plurality of test structure units may have layer structures, each arranged between the first electrode layer and the second electrode layer, the layer structures being different from each other.

In the abovementioned intermediate structure unit for a secondary cell, the test structure units may include a first test structure unit in which the first conductive semiconductor layer and the charging layer are arranged between the first electrode layer and the second electrode layer, a second test structure unit in which the charging layer and the second conductive semiconductor layer are arranged between the first electrode layer and the second electrode layer, a third test structure unit in which the charging layer is arranged between the first electrode layer and the second electrode layer, a fourth test structure unit in which the first conductive semiconductor layer and the second conductive semiconductor layer are arranged between the first electrode layer and the second electrode layer, a fifth test structure unit in which the first conductive semiconductor layer is arranged between the first electrode layer and the second electrode layer, and a sixth test structure unit in which the second conductive semiconductor layer is arranged between the first electrode layer and the second electrode layer.

In the abovementioned intermediate structure unit for a secondary cell, the secondary cell and the test structure unit may be arranged on both faces of a substrate. Accordingly, both the faces can be evaluated for the secondary cells arranged on both faces.

A method for manufacturing a secondary cell according to an aspect of the present invention may include preparing the abovementioned intermediate structure unit for a secondary cell and measuring electrical characteristics of the test structure unit.

In the abovementioned method for manufacturing a secondary cell, it is also possible to further include evaluating performance of the secondary cell arranged in the intermediate structure unit for the secondary cell, and the measuring electrical characteristics of the test structure unit may be performed in a case that the performance of the secondary cell does not satisfy predetermined criteria. Accordingly, it is possible to determine whether a failure is present or absent during abnormality occurrence.

In the abovementioned method for manufacturing a secondary cell, it is also possible to further include separating the test structure unit from the secondary cell in a case that the performance of the secondary cell satisfies the predetermined criteria.

Advantageous Effects of Invention

An object of the present invention is to provide an intermediate structure unit for a secondary cell and a method for manufacturing a secondary cell enabling to perform appropriate evaluation.

DESCRIPTION OF EMBODIMENTS

In the following, embodiments of the present invention will be described with reference to the drawings. The description in the following is simply for preferable embodiments of the present invention and is not intended to limit the scope of the present invention to the following embodiments. In the following, elements having the same reference are to be substantially the same.

[Structure of Quantum Cell]

A technology of a quantum cell is applied to cells of respective embodiments described in the following. Before describing the respective embodiments, brief description will be provided on a quantum cell. A quantum cell is a cell capable of repeatedly performing charging-discharging (a secondary cell) based on an operational principle of enabling to capture electrons by utilizing a photoexcited structural change of a metal oxide semiconductor that is covered with an insulating material.

Figure 1:
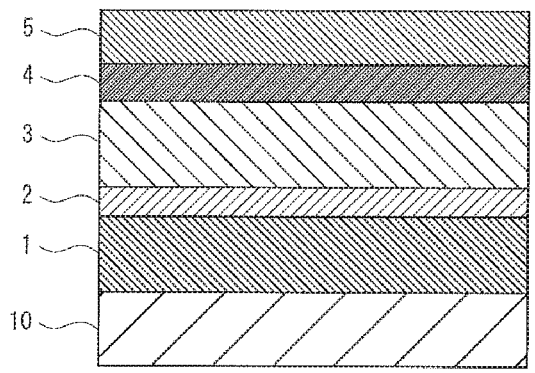
FIG. 1 is a sectional view illustrating a structure of a quantum cell.

A quantum cell is an all-solid-state physical secondary cell and solely functions as a cell. A structural example of a quantum cell is illustrated in FIG. 1. FIG. 1 is a view illustrating a sectional structure of a quantum cell to which the present invention is applied. Here, terminal members such as a positive electrode terminal and a negative electrode terminal and component members such as an exterior member and a cover member are not illustrated in FIG. 1.

A cell 21 has a structure that a first electrode layer 1, an n-type semiconductor layer 2, a charging layer 3, a p-type semiconductor layer 4, and a second electrode layer 5 are layered on a substrate 10. Charging operation is performed when a charging voltage (or a charging power) is applied between the first electrode layer 1 and the second electrode layer 5 and discharging operation is performed when a load is connected between the first electrode layer 1 and the second electrode layer 5. The charging layer 3 is a layer to store (capture) electrons with charging operation, to release the charged electrons with discharging operation, and to keep the electrons (perform storage of electricity) in a state without charging-discharging. The charging layer 3 is formed by applying a photoexcited structural change technology.

The photoexcited structural change is described, for example, in International Patent Publication No. WO2008/053561. When effective excitation energy is applied to an insulation-coated metal oxide semiconductor having a band gap at a predetermined value or higher, a number of energy levels with no electrons are generated in the band gap. The quantum cell is charged by being caused to capture electrons in these energy levels and discharged by being caused to release the captured electrons.

The charging layer 3 is varied to be capable of storing electrons by being filled with insulation-coated n-type metal oxide semiconductor particles and causing the photoexcited structured change to happen at the n-type metal oxide semiconductor with ultrasonic irradiation. The charging layer 3 includes a number of the insulation-coated n-type metal oxide semiconductor particles. It is preferable to use titanium dioxide ($TiO_2$), tin dioxide ($SnO_2$), or zinc oxide (ZnO) as a material of the n-type metal oxide semiconductor that is capable of being used for the charging layer 3. It is also possible to use a material in which titanium dioxide, tin oxide, and zinc oxide are combined. The n-type metal oxide semiconductor in the charging layer 3 is covered, for example, with silicon insulating coating.

The substrate 10 may be made of an insulating material or a conductive material. For example, it is possible to use a glass substrate, a resin sheet of a polymer film, or a metal foil sheet. In a first embodiment, an insulating substrate is used as the substrate 10. In a case that an insulating material is used as the substrate 10, it is also possible to use the substrate 10 as the first electrode layer 1. That is, the conductive substrate 10 functions as the first electrode layer 1. The substrate 10 is plate-shaped or sheet-shaped. The shape in a plane view is not specifically limited as long as that a cell forming region and a test structure unit region described later can be formed thereat. For example, it is possible to be shaped into a rectangle, an elongated belt shape, or the like.

In the present embodiment, the first electrode layer 1 is a negative electrode and the second electrode layer 5 is a positive electrode. The first electrode layer 1 and the second electrode layer 5 are simply required to be formed as conductive films. For example, a silver (Ag) alloy film containing aluminum (Al) or the like may be used as the metal material thereof. Alternatively, the first electrode layer 1 and the second electrode layer 5 may be translucent conductive films of indium tin oxide (ITO) or the like. Examples of a method for forming the conductive film include vapor phase film formation such as sputtering, ion plating, electron beam deposition, vacuum deposition, and chemical deposition. Further, the first electrode layer 1 and the second electrode layer 5 may be formed with an electrolytic plating process, a non-electrolytic plating process, or the like. In general, it is possible to use copper, copper alloy, nickel, aluminum, silver, gold, zinc, tin, or the like as a metal to be used for plating. Here, as described above, in the case that a conductive material is used for the substrate 10, the substrate 10 functions as the first electrode layer 1 and a forming process of the first electrode layer 1 can be skipped.

The n-type semiconductor layer 2 is, for example, an n-type metal oxide semiconductor layer and the material thereof may be titanium dioxide ($TiO_2$), tin dioxide ($SnO_2$), or zinc oxide (ZnO).

The n-type semiconductor layer 2 is formed to prevent the n-type metal oxide semiconductor from directly contacting to the first electrode layer 1 and electrons from being injected to the n-type metal oxide semiconductor due to recombination in a case that insulation coating of the n-type metal oxide semiconductor in the charging layer 3 is insufficient. As illustrated in FIG. 1, the n-type semiconductor layer 2 is formed between the first electrode layer 1 and the charging layer 3. It is also possible to eliminate the n-type semiconductor layer 2.

The p-type semiconductor layer 4 on the charging layer 3 is formed to prevent electrons from being injected from the second electrode layer 5 arranged at the above. A p-type metal oxide semiconductor such as nickel oxide (NiO), copper-aluminum oxide ($CuAlO_2$), and the like may be used as a material of the p-type semiconductor layer 4. As illustrated in FIG. 1, the p-type semiconductor layer 4 is formed between the second electrode layer 5 and the charging layer 3.

In the above description, the n-type semiconductor layer 2 is arranged below the charging layer 3 and the p-type semiconductor layer 4 is arranged thereabove. However, the n-type semiconductor layer 2 and the p-type semiconductor layer 4 may be arranged in an opposite manner. That is, it is also possible that the n-type semiconductor layer 2 is arranged above the charging layer 3 and the p-type semiconductor layer 4 is arranged therebelow. Further, in the case that the n-type semiconductor layer 2 is eliminated, the p-type semiconductor layer 4 may be arranged below the charging layer 3. In such cases, the first electrode layer 1 is a positive electrode and the second electrode layer 5 is a negative electrode. Thus, as long as having a structure that, between the first electrode layer 1 and the second electrode layer 5, the charging layer 3 is sandwiched by the n-type semiconductor layer 2 and p-type semiconductor layer 4 or having a structure including the charging layer 3 and the p-type semiconductor layer 4, the layers may be arranged in any order. In other words, the cell 21 is simply required to have a structure, between the first electrode layer 1 and the second electrode layer 5, that the first metal oxide semiconductor layer, the charging layer 3, and the second metal oxide semiconductor layer are layered in the order thereof or that the charging layer 3 and the metal oxide semiconductor layer are layered in the order thereof.

First Embodiment

In the following, description will be provided on an intermediate structure unit for a quantum cell according to a first embodiment. Here, the intermediate structure unit is a structure unit for manufacturing a quantum cell. That is, the intermediate structure unit is prepared in midstream of a manufacturing process of a quantum cell. For example, a quantum cell may be obtained by processing (e.g., cutting) the intermediate structure unit.

Figure 2:
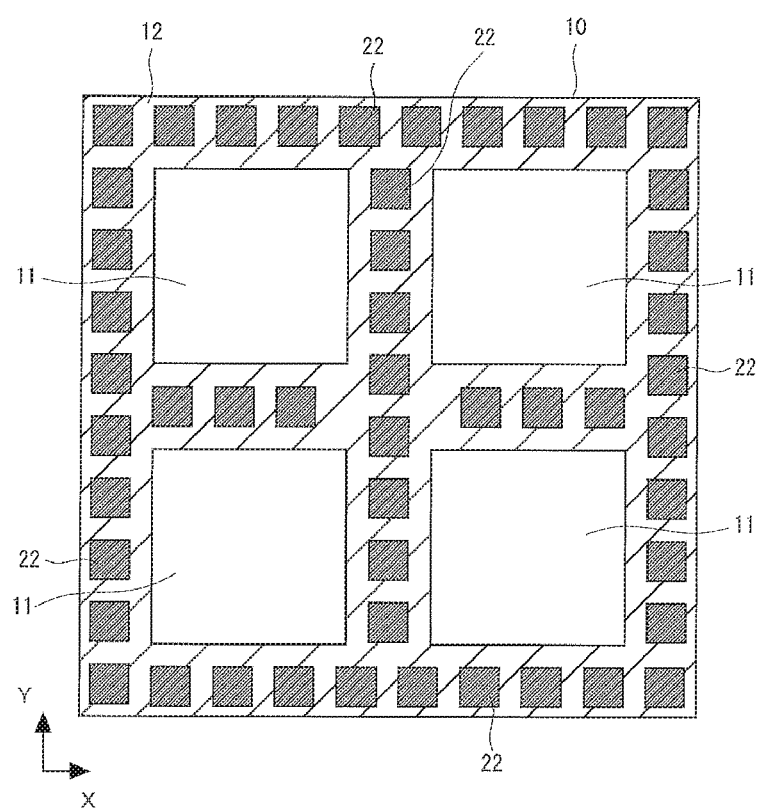
FIG. 2 is a plane view illustrating a structure of an intermediate structure unit.

FIG. 2 is a plane view illustrating a structure of an intermediate structure unit 100. FIG. 2 is illustrated in an X-Y orthogonal coordinate system in which X-direction and Y-direction represent directions along sides of the rectangular substrate 10. The intermediate structure unit 100 includes a cell forming region 11 and a test structure unit forming region 12. On the substrate 10, the test structure unit forming region 12 is arranged outside the cell forming region 11. In FIG. 2, four cell forming regions 11 are arranged in a 2×2 matrix manner. The test structure unit forming region 12 is arranged so that the four cell forming regions 11 are surrounded thereby respectively. That is, the test structure unit forming region 12 is arranged between the cell forming region 11 and an edge of the substrate 10 and between the adjacent cell forming regions 11. Here, location of the test structure unit forming region 12 is not limited to the above. For example, the test structure unit forming region 12 may not be arranged between the adjacent cell forming regions 11 or may be arranged only between a part of plural sides of the substrate 10 and the cell forming region 11.

The cell 21 illustrated in FIG. 1 is formed at each of the cell forming regions 11. A plurality of the test structure units 22 are arranged at the test structure unit forming region 12. The plurality of test structure units 22 are arranged along X-direction and Y-direction. Here, each of the test structure units 22 is formed in a rectangular pattern. The test structure unit 22 is a layered structure unit for evaluating characteristics of the respective layers that form the cell 21. The test structure unit 22 is formed in a smaller size than the cell 21 in a plane view. A plurality of the test structure units 22 are arranged as being adjacent to one cell. The plurality of test structure units 22 are arranged side by side around the cell 21. Naturally, it is only required that one or more test structure units 22 and one or more cells 21 are formed on the substrate 10.

Figure 3:
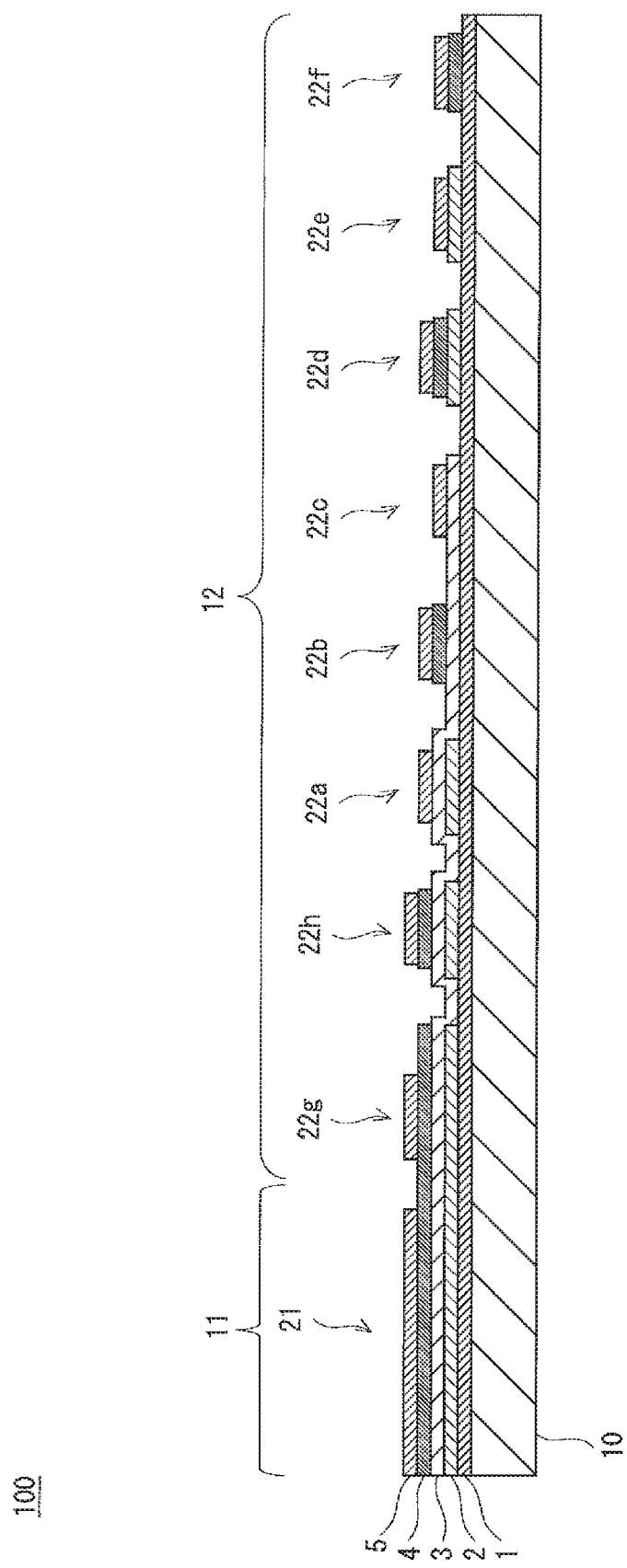
FIG. 3 is a sectional view illustrating a structure of an intermediate structure unit according to a first embodiment.

FIG. 3 illustrates a sectional structure of the intermediate structure unit 100. As illustrated in FIG. 3, the cell 21 is formed at the cell forming region 11. The cell 21 has a structure that the first electrode layer 1, the n-type semiconductor layer 2, the charging layer 3, the p-type semiconductor layer 4, and the second electrode layer 5 are layered on the substrate 10.

A plurality of test structure units 22a to 22h are formed at the test structure unit forming region 12. Similarly to the cell 21, each of the test structure units 22a to 22h includes the first electrode layer 1 and the second electrode layer 5. One or more layers are formed between the first electrode layer 1 and the second electrode layer (hereinafter, called inter-electrode-layer). Then, the test structure units 22a to 22h include equivalently-layered test structure units 22g, 22h and layer-missed test structure units 22a to 22f. In the equivalently-layered test structure units 22g, 22h, the inter-electrode-layer structure is the same as the inter-electrode-layer structure of the cell 21. In the layer-missed test structure units 22a to 22f, the inter-electrode-layer structure is different from the inter-electrode-layer structure of the cell 21. In FIG. 3, the equivalently-layered test structure units are illustrated as two kinds of test structure units being the test structure unit 22g and the test structure unit 22h, separation states of which from the layer structure of the cell 21 being different from each other. Further, the layer-missed test structure units are illustrated as six kinds of test structure units being the test structure units 22a to 22f, layer structures of which are different from one another. In the following description, in a case that a layer structure is not specified, the test structure units 22a to 22h are described as test structure units 22.

The test structure unit 22g and the test structure unit 22h have the same layer structure as the cell 21. Therefore, the test structure units 22g, 22h function as a quantum cell similarly to the cell 21. The test structure units 22g, 22h are different from each other from a viewpoint that respective layers thereof are common to the layers of the cell 21 (i.e., a continuous pattern) or are separated therefrom.

The test structure unit 22g has a pattern that the first electrode layer 1, the n-type semiconductor layer 2, the charging layer 3, and the p-type semiconductor layer 4 are not separated from those of the cell 21 and the second electrode layer 5 is separated from that thereof. That is, the first electrode layers 1 are formed in an integrated pattern for the cell 21 and the test structure unit 22g. Similarly, the n-type semiconductor layers 2, the charging layers 3, and the p-type semiconductor layers 4 are formed respectively in an integrated pattern for the cell 21 and the test structure unit 22g. In other words, the first electrode layers 1, the n-type semiconductor layers 2, the charging layers 3, and the p-type semiconductor layers 4 of the cell 21 and the test structure unit 22g are formed respectively in a continuous pattern. On the other hand, the second electrode layer 5 of the cell 21 and the second electrode layer 5 of the test structure unit 22g are formed in a separated pattern.

In the test structure unit 22h, the first electrode layer 1 and the charging layer 3 are not separated from those of the cell 21. The n-type semiconductor layers 2, the p-type semiconductor layers 4, and the second electrode layers 5 of the cell 21 and the test structure unit 22h are formed respectively in separated manner. That is, the first electrode layers 1 of the cell 21 and the test structure unit 22h are formed in an integrated pattern. Similarly, the charging layers 3 of the cell 21 and the test structure unit 22h are formed in an integrated pattern. In other words, the first electrode layers 1 and the charging layers 3 of the cell 21 and the test structure unit 22h are formed respectively in a continuous pattern. The second electrode layer 5 of the cell 21 and the second electrode layer 5 of the test structure unit 22h are formed in a separated pattern. Similarly, the p-type semiconductor layer 4 and the n-type semiconductor layer 2 of the cell 21 are formed in a separated pattern respectively from the p-type semiconductor layer 4 and the n-type semiconductor layer 2 of the test structure unit 22h. Thus, the n-type semiconductor layer 2, the p-type semiconductor layer 4, and the second electrode layer 5 of the test structure unit 22h are formed respectively in an independent pattern.

Further, the first electrode layers 1 are formed continuously in an integrated pattern for the cell 21, the test structure unit 22h, and the test structure unit 22g. The charging layers 3 are formed continuously in an integrated pattern for the cell 21, the test structure unit 22h, and the test structure unit 22g.

Similarly to the cell 21, each of the test structure units 22a to 22f includes the first electrode layer 1 and the second electrode layer 5. The test structure units 22a to 22f are layer-missed test structure units. In the test structure units 22a to 22f, the inter-electrode-layer structure includes only a part of the inter-electrode-layer structure of the cell 21. For example, in the present embodiment, the cell 21 has three functional layers (i.e., the n-type semiconductor layer 2, the charging layer 3, and the p-type semiconductor layer 4) between the electrode layers. In the test structure units 22a to 22f, one or two layers out of the three layers are formed.

In other words, in the inter-electrode-layer structure of the test structure units 22a to 22f, one or two layers are missed out of the three layers.

The test structure unit 22a has a four-layer structure that the first electrode layer 1, the n-type semiconductor layer 2, the charging layer 3, and the second electrode layer 5 are layered on the substrate 10. That is, the test structure unit 22a has a layer structure that the p-type semiconductor layer 4 is eliminated from that of the cell 21. The lower face of the n-type semiconductor layer 2 is in contact with the upper face of the first electrode layer 1 and the upper face of the n-type semiconductor layer 2 is in contact with the charging layer 3. The upper face of the charging layer 3 is in contact with the lower face of the second electrode layer 5. The first electrode layer 1 and the charging layer 3 are common to those of the cell 21.

That is, the first electrode layer 1 and the charging layer 3 of the test structure unit 22a are not separated from the first electrode layer 1 and the charging layer 3 of the cell 21. The first electrode layers 1 and the charging layers 3 are formed respectively in an integrated pattern for the test structure unit 22a and the cell 21. The n-type semiconductor layer 2 of the test structure unit 22a is formed in a pattern independent from the n-type semiconductor layers 2 of other test structure units. The second electrode layer 5 of the test structure unit 22a is formed in a pattern independent from the second electrode layers 5 of other test structure units 22.

The test structure unit 22b has a four-layer structure that the first electrode layer 1, the charging layer 3, the p-type semiconductor layer 4, and the second electrode layer 5 are layered on the substrate 10. That is, the test structure unit 22b has a layer structure that the n-type semiconductor layer 2 is eliminated from that of the cell 21. The lower face of the p-type semiconductor layer 4 is in contact with the upper face of the charging layer 3 and the upper face of the p-type semiconductor layer 4 is in contact with the second electrode layer 5. The lower face of the charging layer 3 is in contact with the upper face of the first electrode layer 1. The first electrode layer 1 and the charging layer 3 are common to those of the cell 21.

That is, the first electrode layer 1 and the charging layer 3 of the test structure unit 22b are not separated from the first electrode layer 1 and the charging layer 3 of the cell 21. The first electrode layers 1 and the charging layers 3 are formed respectively in an integrated pattern for the test structure unit 22b and the cell 21. The p-type semiconductor layer 4 of the test structure unit 22b is formed in a pattern independent from the p-type semiconductor layers 4 of other test structure units. The second electrode layer 5 of the test structure unit 22b is formed in a pattern independent from the second electrode layers 5 of other test structure units 22.

The test structure unit 22c has a three-layer structure that the first electrode layer 1, the charging layer 3, and the second electrode layer 5 are layered on the substrate 10. That is, the test structure unit 22c has a layer structure that the n-type semiconductor layer 2 and the p-type semiconductor layer 4 are eliminated from that of the cell 21. In other words, in the test structure unit 22c, a single layer of the charging layer 3 is formed between the first electrode layer 1 and the second electrode layer 5. The lower face of the charging layer 3 is in contact with the upper face of the first electrode layer 1 and the upper face of the charging layer 3 is in contact with the lower face of the second electrode layer 5. The first electrode layer 1 and the charging layer 3 are common to those of the cell 21.

That is, the first electrode layer 1 and the charging layer 3 of the test structure unit 22c are not separated from the first electrode layer 1 and the charging layer 3 of the cell 21. The first electrode layers 1 and the charging layers 3 are formed respectively in an integrated pattern for the test structure unit 22c and the cell 21. The second electrode layer 5 of the test structure unit 22c is formed in a pattern independent from the second electrode layers 5 of other test structure units 22.

The test structure unit 22d has a four-layer structure that the first electrode layer 1, the n-type semiconductor layer 2, the p-type semiconductor layer 4, and the second electrode layer 5 are layered on the substrate 10. That is, the test structure unit 22d has a layer structure that the charging layer 3 is eliminated from that of the cell 21. The lower face of the n-type semiconductor layer 21 is in contact with the upper face of the first electrode layer 1 and the upper layer of the n-type semiconductor layer 2 is in contact with the lower face of the p-type semiconductor layer 4. The upper face of the p-type semiconductor layer 4 is in contact with the lower face of the second electrode layer 5. The first electrode layer 1 is common to that of the cell 21.

That is, the first electrode layer 1 of the test structure unit 22d is not separated from the first electrode layer 1 of the cell 21. The first electrode layers 1 are formed in an integrated pattern for the test structure unit 22d and the cell 21. The second electrode layer 5 of the test structure unit 22d is formed in a pattern independent from the second electrode layers 5 of other test structure units 22. The n-type semiconductor layer 2 of the test structure unit 22d is formed in a pattern independent from the n-type semiconductor layers 2 of other test structure units 22. The p-type semiconductor layer 4 of the test structure unit 22d is formed in a pattern independent from the p-type semiconductor layers 4 of other test structure units 22.

The test structure unit 22e has a three-layer structure that the first electrode layer 1, the n-type semiconductor layer 2, and the second electrode layer 5 are layered on the substrate 10. That is, the test structure unit 22e has a layer structure that the charging layer 3 and the p-type semiconductor layer 4 are eliminated from that of the cell 21. The lower face of the n-type semiconductor layer 2 is in contact with the upper face of the first electrode layer 1 and the upper face of the n-type semiconductor layer 2 is in contact with the lower face of the second electrode layer 5. The first electrode layer 1 is common to that of the cell 21.

That is, the first electrode layer 1 of the test structure unit 22e is not separated from the first electrode layer 1 of the cell 21. The first electrode layers 1 are formed in an integrated pattern for the test structure unit 22e and the cell 21. The second electrode layer 5 of the test structure unit 22e is formed in a pattern independent from the second electrode layers 5 of other test structure units 22. The n-type semiconductor layer 2 of the test structure unit 22e is formed in a pattern independent from the n-type semiconductor layers 2 of other test structure units 22.

The test structure unit 22f has a three-layer structure that the first electrode layer 1, the p-type semiconductor layer 4, and the second electrode layer 5 are layered on the substrate 10. That is, the test structure unit 22f has a layer structure that the charging layer 3 and the n-type semiconductor layer 2 are eliminated from that of the cell 21. The lower face of the p-type semiconductor layer 4 is in contact with the upper face of the first electrode layer 1 and the upper face of the p-type semiconductor layer 4 is in contact with the lower face of the second electrode layer 5. The first electrode layer 1 is common to that of the cell 21.

That is, the first electrode layer 1 of the test structure unit 22f is not separated from the first electrode layer 1 of the cell 21. The first electrode layers 1 are formed in an integrated pattern for the test structure unit 22*f* and the cell 21. The second electrode layer 5 of the test structure unit 22*f* is formed in a pattern independent from the second electrode layers 5 of other test structure units 22. The p-type semiconductor layer 4 of the test structure unit 22*f* is formed in a pattern independent from the p-type semiconductor layers 4 of other test structure units 22.

Thus, in the cell 21 and the test structure units 22*a* to 22*g*, the first electrode layers 1 are formed in an integrated pattern as not being separated from one another. Here, the first electrode layer 1 is formed in a solid pattern as being formed on approximately all the surface of the substrate 10. In the cell 21, the test structure unit 22*a*, the test structure unit 22*b*, the test structure unit 22*c*, the test structure unit 22*g*, and the test structure unit 22*h*, the charging layers 3 are formed in an integrated pattern as not being separated from one another. The second electrode layers 5 are separated between the cell 21 and the test structure unit 22. Further, the second electrode layers 5 are separated between the test structure units 22. That is, the second electrode layers 5 are formed in an independent island-like pattern for the test structure units 22 and the cell 21. The second electrode layers 5 are formed as being separated for the respective test structure units 22.

As described above, in the present embodiment, the plurality of test structure units 22 are arranged on the substrate 10 on which the cell 21 is arranged. Two kinds of the test structure units (equivalently-layered test structure units) 22*g*, 22*h* each having the same layer structure as that of the cell 21 are formed at the test structure unit forming region 12. Further, six kinds of the test structure units (layer-missed structure units) 22*a* to 22*f* each having a layer structure different from that of the cell 21 are formed at the test structure unit forming region 12. The layer structures of the six kinds of the test structure units 22*a* to 22*f* are different from one another. Thus, the test structure units 22*a* to 22*h* being eight kinds in total are arranged around the cell 21. Further, it is also possible that a plurality of the test structure units may be arranged on the substrate 10 for each kind of the test structure units 22*a* to 22*h*. For example, two or more of the test structure units 22*a* are arranged on the substrate 10. Similarly, a plurality of the test structure units are arranged on the substrate 10 for each of the test structure units 22*b* to 22*h*.

The number and location of the test structure units 22 to be arranged at the test structure unit forming region 12 are not specifically limited. For example, in the intermediate structure unit 100 illustrated in FIG. 2, 50 pieces of the test structure units 22 are arranged at the test structure unit forming region 12. Specifically, the test structure unit 22 is arranged at each of four corners of the substrate 10. At four sides of the substrate 10, eight pieces of the test structure units 22 are arranged in line along each side thereof in addition to the test structure units arranged at four corners. Further, at the test structure unit forming region 12 between the cells 21, eight pieces of the test structure units are arranged in line along Y-direction and six pieces of the test structure units 22 are arranged in line along X-direction in addition to the test structure units 22 arranged along the respective sides. Any one kind out of the eight kinds of the test structure units 22 is arranged at each position where a test structure unit is arranged. The kind, number, and position of the test structure units 22*a* to 22*h* to be arranged are not specifically limited.

Here, it is preferable that the test structure units 22 being of the same kind are arranged to be scattered on the substrate 10. That is, the test structure units 22 having the same layer structure are arranged at a plurality of positions on the substrate 10. According to the above, it is possible to evaluate variation, gradient, and the like on a plane of the respective layers. For example, in FIG. 2, the test structure units 22*a* are arranged at different positions along X-direction. Accordingly, it is possible to evaluate characteristics of variation, gradient, and the like of the test structure units 22*a* in X-direction. Further, it is also possible to evaluate variation thereof in Y-direction by scattering a plurality of the test structure units 22*a* similarly in Y-direction. Similarly, regarding the test structure units 22*b* to 22*h* each having another layer structure, variation and the like on a plane can be evaluated by arranging, on the substrate 10, a plurality of the test structure units 22 having the same layer structure.

Further, in a case that a plurality of lines on which the test structure units 22 are arranged exist at different positions and in different directions, it is preferable that all kinds of test structure units are arranged on each line. According to the above, it is possible to evaluate layer characteristics on each line and to compare measurement results of different lines. For example, in the case of having six lines being an upper side line, a lower side line, a left side line, a right side line, an X-direction center line, and a Y-direction center line as illustrated in FIG. 2, all kinds of the test structure units 22*a* to 22*h* may be arranged on each line.

The second electrode layers 5 of the test structure units 22*a* to 22*h* are formed respectively in a separated pattern. Here, the test structure units 22*a* to 22*h* can be independently examined while the second electrode layers 5 of the test structure units 22*a* to 22*h* function as test element group (TEG) pads respectively.

For example, for forming the cell 21 and the test structure units 22*a* to 22*h*, all the layers being the first electrode layer 1, the n-type semiconductor layer 2, the charging layer 3, the p-type semiconductor layer 4, and the second electrode layer 5 are layered on the substrate 10. After the layering, a power supply source (a voltage source, a current source, and the like) required for measurement and measurement equipment (a voltage meter, a current meter, and the like) required for measuring electrical characteristics are connected to between the first electrode layer 1 and the second electrode layer 5 of any of the test structure units 22*a* to 22*h* to be measured. Electrical characteristics of the test structure unit 22 to which the measurement equipment is connected are evaluated. Each layer of the test structure unit 22 and each layer of the cell are formed at the same timing with the same process. Accordingly, owing to that the electrical characteristics of the test structure unit 22 are measured and compared with those of other test structure units 22, it is possible to evaluate the respective layers of the cell 21.

It is preferable that the second electrode layer 5 of the respective test structure units 22 have the same shape in a plane view from a viewpoint of easiness for performing comparison and evaluation of the measurement results. For example, the second electrode layers 5 independently formed for the respective test structure units 22 are formed in a pattern having the same shape in the X-Y plane view. It is also preferable that separated layers other than the second electrode layers 5 have the same shape in a plane view for each layer. For example, in the example illustrated in FIG. 3, the second electrode layers 5 have the same shape in a plane view for the respective test structure units 22*a* to 22*h*. The n-type semiconductor layers 2 have the same shape in a plane view for the respective test structure units 22*h*, 22*a*, 22*d*, 22*e*. Further, it is preferable that the p-type semiconductor layers 4 have the same shape in a plane view for the respective test structure units 22*h*, 22*b*, 22*d*, 22*f*. In other words, measurement conditions for evaluation can be matched owing to that the patterns of the test structure units 22 formed independently from other test structure units 22 have the same shape.

Figure 4:
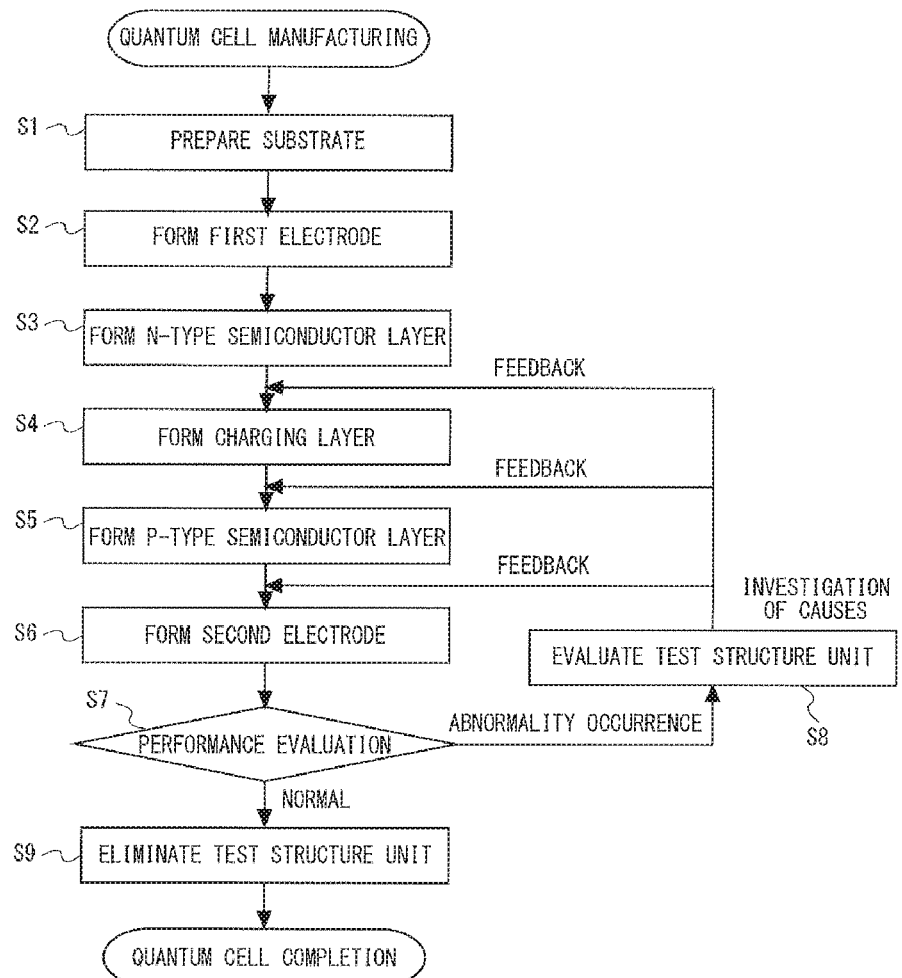
FIG. 4 is a flowchart indicating manufacturing processes of a cell.

Next, a method for manufacturing a cell according to the present embodiment will be described with reference to FIG. 4. FIG. 4 is a flowchart indicating a method for manufacturing the cell 21.

For manufacturing a quantum cell, first, the substrate 10 is prepared (step S1). As describe above, the substrate 10 is plate-shaped or sheet-shaped as being insulating or conductive. For example, it is possible to use therefor a glass substrate, a resin sheet of a polymer film, or a metal foil sheet. The substrate 10 has a shape in a plane view on which the cell forming region and the test structure unit region can be arranged.

Subsequently, the first electrode layer 1 is formed on the substrate 10 (step S2) prepared in step S1. As described above, the first electrode layer 1 is a silver (Ag) alloy film containing aluminum (Al) or the like and can be formed with vapor phase film formation such as sputtering, ion plating, electron beam deposition, vacuum deposition, and chemical deposition. The first electrode layer 1 is formed on approximately all the surface of the substrate 10. Thus, the first electrode layer becomes common for the cell 21 and the test structure units 22. Here, in the case that the substrate 10 is made of a conductive material to function as the first electrode layer as well, the first electrode layer 1 can be eliminated and step S2 can be skipped.

Subsequently, the n-type semiconductor layers 2 are formed on the first electrode layer 1 (step S3). As described above, the n-type semiconductor layers 2 are n-type metal oxide semiconductor layers made of titanium dioxide ($TiO_2$), tin dioxide ($SnO_2$), zinc oxide (ZnO), or the like. For example, the n-type semiconductor layers 2 are formed with sputtering. Here, the n-type semiconductor layers 2 are formed in a predetermined pattern with sputtering using a mask. That is, the n-type semiconductor layers 2 are formed by using a mask having openings at positions where the cell 21, the test structure unit 22g, the test structure unit 22h, the test structure unit 22a, the test structure unit 22d, or the test structure unit 22e is arranged.

At that time, owing to using a mask having a common opening, the n-type semiconductor layers 2 are formed in a continuous pattern for the cell 21 and the test structure unit 22g. Accordingly, the n-type semiconductor layers 2 are integrally formed for the cell 21 and the test structure unit 22g. Further, the n-type semiconductor layers 2 are formed by using a mask having individual openings at positions where the test structure unit 22h, the test structure unit 22a, the test structure unit 22d, or the test structure unit 22e is arranged. Thus, at positions where the test structure unit 22h, the test structure unit 22a, the test structure unit 22d, or the test structure unit 22e is arranged, the n-type semiconductor layers 2 are formed in a mutually-separated pattern. Here, in the case that the n-type semiconductor layer 2 is eliminated, step S3 can be skipped.

The charging layer 3 is formed on the first electrode layer 1 and the n-type semiconductor layer 2 (S4). For example, the charging layer 3 can be formed with a coating pyrolysis method. Specifically, coating liquid obtained by mixing aliphatic acid titanium and silicon oil into solvent is coated, is dried, and thereafter, is burned. Thus, a particle layer of titanium dioxide covered with an insulting film is formed.

Owing to that the formed layer is irradiated with ultraviolet, an interatomic distance of titanium dioxide is changed and the photoexcited structural change phenomenon is caused. As a result, a new energy level is formed in a band gap of the titanium dioxide. Charging can be performed by electrons being captured to the new energy level. The charging layer 3 is formed through the above processes.

The charging layer 3 is formed in a continuous pattern at each position where the cell 21, the test structure unit 22g, the test structure unit 22h, the test structure unit 22a, the test structure unit 22b, or the test structure unit 22c is arranged. Here, the coating liquid may be coated only at a predetermined pattern for forming the charging layer 3 in the predetermined pattern. Alternatively, it is also possible to eliminate the coating liquid at positions other than the predetermined pattern after the coating liquid is coated. In this case, for example, the coating liquid before being dried is wiped off. Alternatively, it is also possible that the charging layer at positions other than the predetermined pattern is eliminated after the charging layer 3 is formed. In this manner, it is possible to form the test structure units 22g, 22h, 22a, 22b, 22c each having the charging layer 3 and the test structure units 22d, 22e, 22f each not having the charging layer 3.

As described above, the n-type semiconductor layers 2 are formed in the predetermined pattern in step S3. Accordingly, the charging layer 3 is formed on the n-type semiconductor layer 2 where the n-type semiconductor layer 2 is formed and the charging layer 3 is formed directly on the first electrode layer 1 where the n-type semiconductor layer 2 is not formed.

Here, when the test structure units 22g, 22h, 22a, 22b, 22c each having the charging layer are arranged at adjacent positions, it is preferable from a viewpoint of easiness of charging layer forming operation. In particular, the operation is facilitated for coating or eliminating the coating liquid for the charging layer forming.

For example, it is preferable that the test structure unit 22d, 22e, 22f is not arranged between the test structure units 22g, 22h, 22a, 22b, 22c. Here, in the X-Y plane view, the test structure unit 22d, 22e, 22f is not arranged between the test structure unit 22g and the test structure unit 22h. Further, the test structure unit 22d, 22e, 22f is not arranged at a region between other test structure units 22a, 22b, 22c. In other words, the test structure units 22d, 22e, 22f each not having the charging layer 3 are to be continuously arranged.

Here, the present embodiment discloses a case that the charging layers 3 are integrally formed for the cell 21 and the test structure units 22g, 22h, 22a, 22b, 22c. However, it is also possible to form the charging layers 3 in a predetermined separated pattern. For example, the charging layer is formed in a mutually-separated pattern at positions where the cell 21, the test structure unit 22g, the test structure unit 22h, the test structure unit 22a, the test structure unit 22b, or the test structure unit 22c is arranged. In such a case, as described above, the coating liquid may be coated only at the predetermined pattern as well. Alternatively, it is also possible to eliminate the coating liquid at positions other than the predetermined pattern after the coating liquid is coated. In this case, for example, the coating liquid before being dried is wiped off. Alternatively, it is also possible that the charging layer at positions other than the predetermined pattern is eliminated after the charging layer 3 is formed. Here, the charging layers 3 may have the same shape in a plane view for the respective test structure units 22.

Subsequently, the p-type semiconductor layers 4 are formed on the first electrode layer 1, the n-type semiconductor layer 2, and the charging layer 3 (step S5). As described above, the p-type semiconductor layers 4 are p-type metal oxide semiconductors made of nickel oxide (NiO), copper-aluminum oxide ($CuAlO_2$), or the like. For example, the p-type semiconductor layers 4 are formed with sputtering. Here, similarly to the n-type semiconductor layers 2, the p-type semiconductor layers 4 are formed in a predetermined pattern with sputtering using a mask. That is, the p-type semiconductor layers 4 are formed by using a mask having openings at positions where the cell 21, the test structure unit 22*g*, the test structure unit 22*h*, the test structure unit 22*b*, the test structure unit 22*d*, or the test structure unit 22*f* is arranged. At that time, owing to using a mask having a common opening, the p-type semiconductor layers 4 are formed in a continuous pattern for the cell 21 and the test structure unit 22*g*. Further, the p-type semiconductor layers 4 are formed by using a mask having individual openings at positions where the test structure unit 22*h*, the test structure unit 22*b*, the test structure unit 22*d*, or the test structure unit 22*f* is arranged, so that the p-type semiconductor layers 4 are formed in a mutually-separated pattern.

As described above, according to step S3 and step S4, the n-type semiconductor layers 2 and the charging layers 3 are formed respectively in a predetermined pattern. At positions where the n-type semiconductor layer 2 or the charging layer 3 is formed as the uppermost layer, the p-type semiconductor layer 4 is formed thereon. At positions where the n-type semiconductor layer 2 and the charging layer 3 are not formed, the p-type semiconductor layer 4 is formed directly on the first electrode layer 1.

Subsequently, the second electrode layers 5 are formed on the first electrode layer 1, the n-type semiconductor layer 2, the charging layer 3, and the p-type semiconductor layer 4 (step S6). Here, as described above, similarly to the first electrode layer 1, the second electrode layers 5 are silver (Ag) alloy films containing aluminum (Al) or the like and can be formed with vapor phase film formation such as sputtering, ion plating, electron beam deposition, vacuum deposition, and chemical deposition. For example, the second electrode layers 5 are formed in a predetermined pattern by using a mask. Specifically, the second electrode layers 5 are formed in a mutually-separated pattern for the cell 21, and the test structure units 22*a* to 22*h*.

As described above, according to step S3 to step S5, the n-type semiconductor layers 2, the charging layers 3, and the p-type semiconductor layers 4 are formed respectively in a predetermined pattern. At positions where the n-type semiconductor layer 2, the charging layer 3, or the p-type semiconductor layer is formed as the uppermost layer, the second electrode layer 5 is formed thereon.

In this manner, according to step S1 to step S6, the intermediate structure unit 100 that includes the cells 21 and the test structure units 22 is completed.

Performance of the cell 21 prepared through step S1 to step S6 is evaluated (step S7). Here, characteristics of the cell 21 arranged in the intermediate structure unit 100 are measured respectively. For example, it is determined whether or not electrical performance of the cell 21 such as charging-discharging characteristics satisfies predetermined criteria.

Regarding an evaluation method of the cell 21, it is possible to utilize an evaluation apparatus and an evaluation method disclosed, for example, in Patent Document 1. For example, the evaluation apparatus includes a first probe and a second probe. The evaluation apparatus includes a voltage source that applies charging current and a current source (load) that extracts discharging current. According to the evaluation apparatus, the voltage source or the current source is connected to between both the probes in an alternatively selectable manner. Further, the evaluation apparatus includes a voltage meter that measures voltage between both the probes and a current meter that measures current flowing between both the probes.

Then, the first probe is connected to the first electrode layer and the second probe is connected to the second electrode layer. For example, the first probe is connected to a position where the first electrode layer 1 is exposed to a front face in the cell forming region 11 or the test structure unit forming region 12 (including a back face when the substrate 10 functions as the first electrode layer 1 as well). The second probe is connected to any position on a front face of the second electrode layer 5 of the cell 21. Thus, both the probes are connected to the cell 21 to be evaluated to be in a state of being capable of performing charging-discharging.

Then, the voltage source is connected to between both the probes, so that the evaluation apparatus charges the cell 21 with a predetermined charging method (e.g., charging at constant current or constant voltage etc.). The evaluation apparatus measures voltage and charging time from a non-charged state to a fully-charged state. Further, the current source is connected to between both the probes, so that the evaluation apparatus discharges the cell 21 to cause current to flow in a direction opposite to that during charging. The evaluation apparatus measures voltage and discharging time from the fully-charged state to the non-charged state. Further, it is also possible to perform evaluation as measuring voltage right after fully-charged. The second probe may be connected to a single point or a plurality of points on the second electrode layer. The cell 21 is evaluated based on the electrical characteristics measured as described above.

Here, electrical characteristics of the equivalently-layered test structure unit 22*g*, 22*h* may be measured and used for evaluation as evaluation of the cell 21. Further, treatment such as conditioning and aging may be performed by performing charging-discharging operation of the cell 21 before the evaluation in step S7. In this case, electrical characteristics of the cell 21 measured during the treatment may be used for evaluation in step S7.

In step S7, when the performance of the cell 21 satisfies the predetermined criteria, the cell 21 is determined as being normal. When all the cells 21 arranged in the single intermediate structure unit 100 are determined as being normal, the intermediate structure unit 100 is determined as being normal ("normal" in step S7).

The test structure unit forming region 12 is removed (step S8) from the intermediate structure unit 100 determined as being normal in step S7, so that a basic structure of a quantum cell is completed. The removal of the test structure unit forming region 12 can be performed by cutting off the test structure units 22 from the cell 21, for example, with cutting at the boundary between the test structure unit forming region 12 and the cell forming region 11 of the intermediate structure unit 100. Accordingly, the test structure units 22 are separated from the cell 21. The cells 21 arranged at the intermediate structure unit 100 are divided into pieces. Thus, the cells 21 satisfying the predetermined criteria can be manufactured. Here, it is also possible that a part of the test structure units 22 is left without completely removing the test structure unit forming region 12. For example, the test structure units 22 can be used for testing after manufacturing cells or diverted to terminal members.

The cell 21 manufactured as described above functions alone as a quantum cell. Here, it is possible to arrange terminal members such as a positive electrode terminal and a negative electrode terminal and component members such as an exterior member and a cover member as required.

Further, at that time, it is also possible to combine a plurality of the cells 21 to be a single cell.

In step S7, when the performance of the cell 21 does not satisfy the predetermined criteria, it is determined as being abnormal with the performance of the cell 21. The intermediate structure unit 100 having the cell 21 that has been determined as being abnormal with the performance is determined as being abnormal ("abnormality occurrence" in step S7). The intermediate structure unit 100 determined as being abnormal is evaluated based on the electrical characteristics of the test structure units 22 (S8). Causes of malfunction are investigated based on the evaluation results and feedback is provided to each step.

As a method of the determination, it is determined whether or not the measurement result of the test structure unit 22 is included in an allowable range. For example, the allowable range of electrical characteristic values for each kind of the test structure units 22 is established in advance. It is determined whether or not each test structure unit 22 of the intermediate structure unit 100 that has been determined as being abnormal is within the allowable range. In a case that a bias exists for kinds of test structure units 22 being out of the allowable range, it is possible to presume, based on the above, which layer forming process has failed. In a case that a bias exists for positions of the test structure units 22 being out of the allowable range, presumption can be obtained on a failure relating positions.

As another method of the determination, it is possible to compare electrical characteristic values between the same kinds of test structure units arranged at the same intermediate structure unit 100. In this case, presumption can be obtained on a failure relating to positions for forming each layer.

Further, it is also possible to compare with the test structure unit 22 of the same kind at the same position in a different intermediate structure unit 100 that has been determined as being normal. In this case, presumption can be obtained on a failure caused by difference of timing of manufacturing, used equipment, and the like.

As the electrical characteristics to be used for the determination, for example, electrical characteristics such as current-voltage (I-V) characteristics may be measured for each of the test structure units 22a to 22h. Further, it is also possible to measure electrical characteristics (e.g., charging-discharging characteristics) being the same as the electrical characteristics measured for the cell 21 in step S7.

Figure 5:
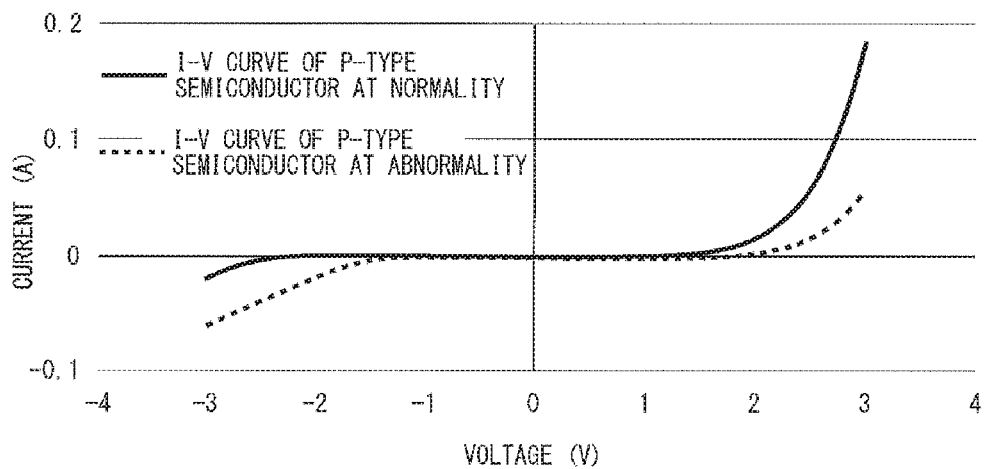
FIG. 5 is a view illustrating an I-V curve of a p-type semiconductor layer.

FIG. 5 illustrates I-V characteristics of a structure that a single layer being the p-type semiconductor layer 4 is arranged between the first electrode layer 1 and the second electrode layer 5, that is, the test structure unit 22f. In FIG. 5, the horizontal axis represents voltage (V) and the vertical axis represents current (A). FIG. 5 illustrates I-V characteristics of a normal p-type semiconductor layer 4 and I-V characteristics of an abnormal p-type semiconductor layer 4. It is possible to determine whether the test structure unit is normal or abnormal by utilizing I-V characteristics of each test structure unit.

Specifically, an I-V curve is measured while terminals (probes) of the measurement equipment are contacted to the second electrode layer 5 and the first electrode layer 1 of each test structure unit 22. The I-V curve of each test structure unit 22 is independently measured. Measurement of the electrical characteristics of the test structure unit 22 may be performed concurrently or sequentially.

For example, with the test structure units 22e, 22f each having one kind of the semiconductor layers without having the charging layer 3, I-V characteristics of the n-type semiconductor layer 2 or p-type semiconductor layer 4 can be evaluated. With the test structure unit 22d having two kinds of semiconductor layers without having the charging layer 3, I-V characteristics of a diode to which the n-type semiconductor layer 2 and the p-type semiconductor layer 4 are joined can be evaluated. With the test structure units 22a, 22b each having the charging layer 3 and one kind of the semiconductor layers, I-V characteristics of a secondary cell in which the n-type semiconductor layer 2 or the p-type semiconductor layer 4 is layered to the charging layer 3 can be evaluated. With the test structure unit 22c having the charging layer 3 and without having any of two kinds of the semiconductor layers, I-V characteristics of a secondary cell having the charging layer 3 as a single layer can be evaluated. With the test structure units 22g, 22h each having the same layer structure as the cell 21, I-V characteristics of a secondary cell can be evaluated. Thus, a failed process can be reliably specified by evaluating each test structure unit 22.

For example, a failed layer can be specified based on I-V characteristics of the test structure units 22a to 22f. Any of the test structure units 22a to 22f having I-V characteristics without satisfying predetermined criteria is specified among six kinds of the layer-missed structure units 22a to 22f. For example, I-V characteristics of the test structure units 22a to 22f are measured in advance for the intermediate structure unit 100 having normal cells 21. Then, the evaluation criteria for determining the allowable range is established based on the above results. The characteristic results of the test structure units 22a to 22f is compared with the evaluation criteria.

That is, when the characteristics of the measured test structure unit satisfy the evaluation criteria, the test structure unit is determined as being normal. When it does not satisfy the evaluation criteria, the test structure unit 22a to 22f is determined as being abnormal. Based on difference between layer structures of the test structure unit 22a to 22f determined as being abnormal and the test structure unit determined as being normal, it is possible to discriminate between a normal layer and an abnormal layer. Specifically, in a case that characteristics of the test structure units 22b, 22d, 22f, 22h, 22g each having the p-type semiconductor layer 4 does not satisfy the evaluation criteria and the test structure units 22a, 22c, 22e each not having the p-type semiconductor layer 4 satisfy the evaluation criteria, it is determined that the p-type semiconductor layer 4 is abnormal.

In this manner, it is possible to specify which process has caused a failure. When the failed process is specified, feedback is provided to the manufacturing process. According to the above, the manufacturing process can be improved and occurrence of a process failure can be prevented in subsequent lots. Accordingly, yield can be improved and productivity can be improved.

Thus, in the present embodiment, the test structure units 22 are arranged for evaluating process states based on measured characteristic values. Further, since a plurality of the test structure units 22a to 22f are arranged on the substrate 10, it is possible to evaluate relations with a unit process and a unit device as well as a process failure. It is possible for a quantum cell to improve characteristics and stabilize quality by providing feedback to process conditions when a failure is detected. Naturally, it is possible, for each test structure unit 22, to perform measurement of characteristics other than I-V characteristics and measurement of a plurality of characteristics.

Further, the present embodiment includes the test structure units 22c, 22e, 22f in which a single layer of each layer is formed between the first electrode layer 1 and the second electrode layer 5 and the test structure units 22d, 22e, 22f without having the charging layer 3. In a case that cell performance is lowered, owing to that electrical characteristics of the single layer of each layer structure are evaluated in step S7, it is possible to easily detect which layer has failed and from when the failure has occurred. For example, in a case that a failure has occurred during evaluating performance of the cell 21 in the intermediate structure unit 100, I-V characteristics of the test structure unit 22 in the same intermediate structure unit 100 is measured. As illustrated in FIG. 5, by comparing the I-V characteristics of each layer in normality with the I-V characteristics in abnormality, it is possible to evaluate which layer has failed. Further, it is also possible to obtain relations among electrical characteristics of the respective layers and to utilize the relations for improving characteristics and stabilizing quality by providing feedback to process conditions. According to the method for manufacturing of the present embodiment, since quality of the cells 21 can be controlled, productivity can be improved.

As described in the present embodiment, more appropriate evaluation can be performed by arranging the test structure units 22 in the intermediate structure unit 100. For example, it is possible to identify a failed layer and to measure distribution on a plane.

Here, there may be a case that a cell determined as being normal is included as a part of the plurality of cells 21 in the intermediate structure unit 100 determined as being abnormal in step S7. In this case, the normal cell 21 is cut off from the test structure units 22 and the cells 21 determined as being abnormal. Thus, it becomes possible to extract only the cell 21 determined as being normal. With the method described as step S9, the normal cell 21 can be separated from the test structure units 22 and the cells 21 determined as being abnormal.

Further, there may be a case that a part of the plurality of cells 21 is determined as being abnormal in the intermediate structure unit 100 determined as being abnormal in step S7. In this case, only the test structure unit 22 being adjacent to the cell 21 determined as being abnormal may be evaluated in step S8.

Here, an insulating substrate is used as the substrate 10 in the present embodiment. It is also possible to use a sheet-shaped member as the substrate 10. Further, it is disclosed that four cells 21 are arranged on the substrate 10. However, the number, size, and shape of cells 21 to be arranged on the substrate 10 are not specifically limited.

The test structure units 22 are separated from the cells 21 by cutting the substrate 10 after cell performance is evaluated in step S7. According to the above, an unnecessary region of the substrate 10, that is, the test structure unit forming region 12, is separated from the finally-obtained cell 21. Accordingly, the cell 21 can be downsized.

In the above description, six kinds of the test structure units 22a to 22f are arranged for all the combinations of the n-type semiconductor layer 2, the charging layer 3, and the p-type semiconductor layer 4 that are arranged between the first electrode layer 1 and the second electrode layer 5. According to the above, evaluation can be performed more appropriately. Naturally, all of the six kinds of the test structure units 22a to 22f may not be arranged. That is, it is simply required that at least one kind of the test structure units 22a to 22f is arranged in the intermediate structure unit 100. Owing to measuring electrical characteristics of the test structure unit 22, each layer can be appropriately evaluated.

For example, it is also possible to arrange the test structure unit 22, the layer structure of which does not include the charging layer 3. Accordingly, characteristics of the n-type semiconductor layer 2 and the p-type semiconductor layer 4 can be appropriately evaluated.

Further, it is also possible to arrange the test structure unit 22, the layer structure of which does not include either the n-type semiconductor layer 2 or the semiconductor layer 4. In other words, the test structure unit 22 in which the charging layer 3 is in contact at least with one of the first electrode layer 1 or the second electrode layer 5 is arranged. Accordingly, characteristics of the charging layer 3 can be appropriately evaluated.

It is also possible that a plurality of the test structure units 22 are arranged and the plurality of test structure units 22 have layer structures, each arranged between the first electrode layer 1 and the second electrode layer 5, being different from one another. Accordingly, each layer can be appropriately evaluated and the failed manufacturing process can be specified.

Second Embodiment

Figure 6:
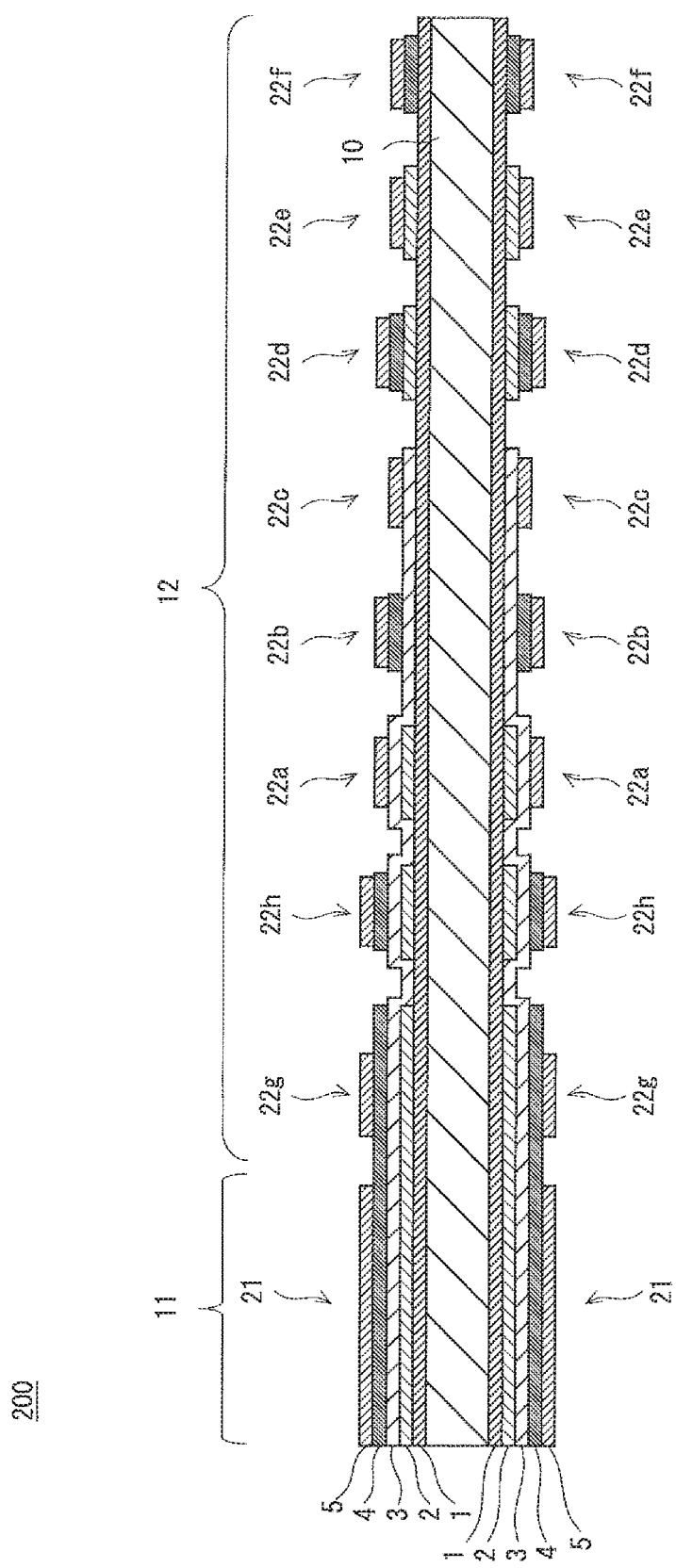
FIG. 6 is a sectional view illustrating a structure of an intermediate structure unit according to a second embodiment.

Structure of an intermediate structure unit 200 for a cell according to the present embodiment will be described with reference to FIG. 6. FIG. 6 is a sectional view schematically illustrating a structure of the intermediate structure unit 200. In the present embodiment, a sheet-shaped member is used as the substrate 10. The cells 21 are arranged on both faces being the upper face and lower face of the insulating substrate 10.

In the present embodiment, the cells 21 are arranged on both faces of the sheet-shaped substrate 10. Accordingly, cells 21 having higher-capacity can be obtained. Further, the test structure units 22a to 22h are arranged on both faces of the substrate 10 as well. Similarly to the first embodiment, electrical characteristics are measured for the test structure units 22a to 22h arranged on both faces of the substrate 10. Accordingly, it is possible to evaluate performance variation on both faces of the substrate 10, tendency on each face, and the like.

Manufacturing processes of a cell according to the present embodiment are similar to the flow of FIG. 4 as described in the first embodiment. For example, after the first electrode layer 1 is formed on one face of the substrate 10, the first electrode layer 1 is formed on the other face. After layer forming is performed on both faces of the substrate 10 as described above, the next layer forming is to be performed. Owing to that each step is performed alternately on the upper face and lower face, characteristics of the cells 21 on both faces can be approximately evened. Owing to that the burning process is performed at once for the charging layers 3 on both faces, the charging layer 3 on both faces can have the same thermal history. Naturally, it is also possible to form two or more layers continuously on one face of the substrate 10 and form layers on the other face thereof. Further, layers may be formed concurrently on both faces.

In FIG. 6, planar arrangement of the test structure units 22a to 22h is the same on both faces of the substrate 10. Accordingly, the test structure units 22 on the upper face and the test structure units 22 on the lower face can be formed under the same conditions. Further, the same mask can be used for layer forming.

Naturally, the planar arrangement of the test structure units 22a to 22h of both faces of the substrate 10 may be different from each other. For example, in FIG. 6, the test structure unit 22a on the upper face is at the same planar position as the test structure unit 22a on the lower face. However, for example, the test structure units 22 having different layer structures may be arranged at the same planar position. For example, the test structure unit 22a on the upper face is at the same planar position as the test structure unit 22b. Alternatively, the test structure units 22 on the upper face and the test structure units 22 on the lower face are arranged as being shifted to each other. For example, the test structure unit 22a on the lower face is arranged at a planar position between the test structure unit 22a and the test structure unit 22b on the upper face. According to the above, it becomes possible to evaluate distribution on a plane in more detail. Here, it is also possible to cause the substrate 10 to function as the first electrode layer 1 as well by using a conductive material for the substrate 10. In this case, the first electrode layers 1 on both faces of the substrate 10 can be eliminated.

Third Embodiment

Figure 7:
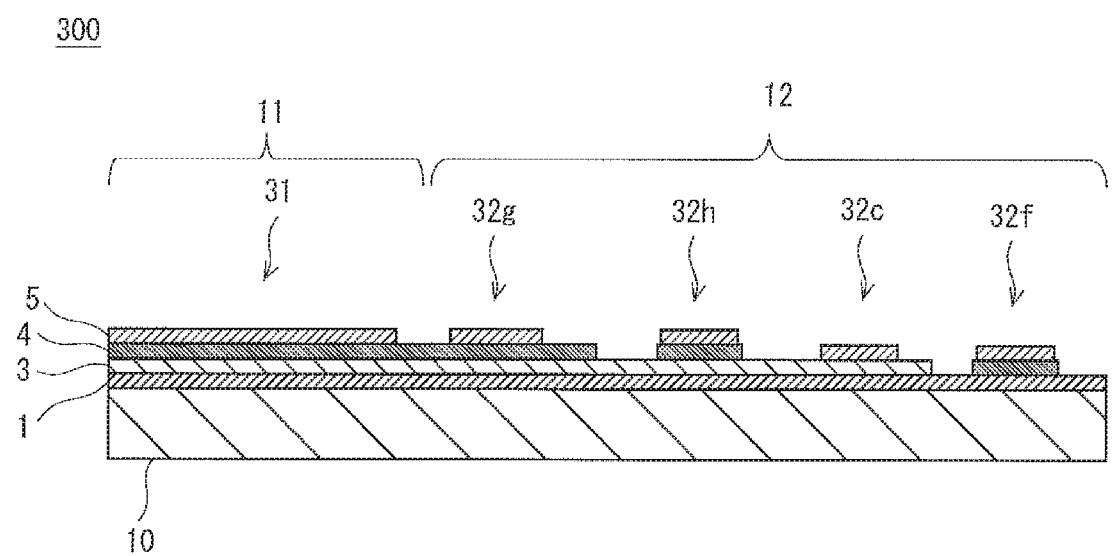
FIG. 7 is a sectional view illustrating a structure of an intermediate structure unit according to a third embodiment.

Structure of an intermediate structure unit 300 for a cell according to the present embodiment will be described with reference to FIG. 7. FIG. 7 is a sectional view schematically illustrating a structure of the intermediate structure unit 300. In the third embodiment, a sectional structure of a cell 31 is different from that of the cell 21 in the first and second embodiments. Since a plane view of the intermediate structure unit 300 is the same as FIG. 2, it is skipped here. Further, description reductant to the first and second embodiments is appropriately skipped as well.

In the intermediate structure unit 300 according to the present embodiment, the cell 31 has a layer structure without having the n-type semiconductor layer 2. That is, in the cell 31, the first electrode layer 1, the charging layer 3, the p-type semiconductor layer 4, and the second electrode layer 5 are formed on the substrate 10 sequentially from the bottom.

Since the layer structure of the cell 31 is different from that of the first embodiment, kinds of the test structure units 32 are different from those of the first embodiment. Since the cell 31 does not include the n-type semiconductor layer 2, the test structure units 32 do not include the n-type semiconductor layer 2 as well. Accordingly, the number of the kinds of the test structure units 32 is lessened. Here, four kinds of test structure units 32g, 32h, 32c, 32f are arranged on the substrate 10. Specifically, since two layers are formed between the electrode layers of the cell 31, one or two layers are formed between the electrode layers of the test structure unit 32.

The test structure units 32g, 32h are equivalently-layered test structure units having the same layer structure as the cell 31. That is, each of the test structure units 32g, 32h has a layer structure that the first electrode layer 1, the charging layer 3, the p-type semiconductor layer 4, and the second electrode layer 5 are formed on the substrate 10 in the order thereof. Each of the test structure units 32g, 32h has a two-layer structure being the p-type semiconductor layer 4 and the charging layer 3 between the electrode layers.

Each of the test structure units 32c, 32f has a single-layer structure including the p-type semiconductor layer 4 or the charging layer 3 between the electrode layers. The test structure units 32c, 32f are layer-missed test structure units, of which layer structure is different from that of the cell 31.

The layer structure of the test structure unit 32c is the same as that of the test structure unit 22c of the first embodiment. That is, in the test structure unit 32c, the first electrode layer 1, the charging layer 3, and the second electrode layer 5 are formed on the substrate 10. That is, the test structure unit 32c has a layer structure that the p-type semiconductor layer 4 is eliminated from the cell 31.

The layer structure of the test structure unit 32f is the same as that of the test structure unit 22f of the first embodiment. That is, in the test structure unit 32f, the first electrode layer 1, the p-type semiconductor layer 4, and the second electrode layer 5 are formed on the substrate 10. That is, the test structure unit 32f has a layer structure that the charging layer 3 is eliminated from the cell 31.

The p-type semiconductor layers 4 are formed in an integrated pattern for the test structure unit 32g and the cell 31. The p-type semiconductor layer 4 of the test structure unit 32h is formed in a pattern independent from the p-type semiconductor layers 4 of the cell 31 and other test structure units 32. The p-type semiconductor layer 4 of the test structure unit 32f is formed in a pattern independent from the p-type semiconductor layers 4 of the cell 31 and other test structure units 32.

The charging layers 3 are formed in an integrated pattern for the test structure unit 32g, the test structure unit 32h, the test structure unit 32c, and the cell 31. That is, the charging layers 3 are not separated respectively between the test structure unit 32g, the test structure unit 32h, the test structure unit 32c, and the cell 31.

The second electrode layers 5 are formed in a pattern independent from one another for the cell 31, the test structure unit 32g, the test structure unit 32h, the test structure unit 32c, and the test structure unit 32f.

Thus, even though the cell 31 has the layer structure being different from that of the first embodiment, evaluation can be appropriately performed by forming the test structure units 32 on the substrate 10. Thus, it is possible to obtain effects similar to the first embodiment.

Fourth Embodiment

Figure 8:
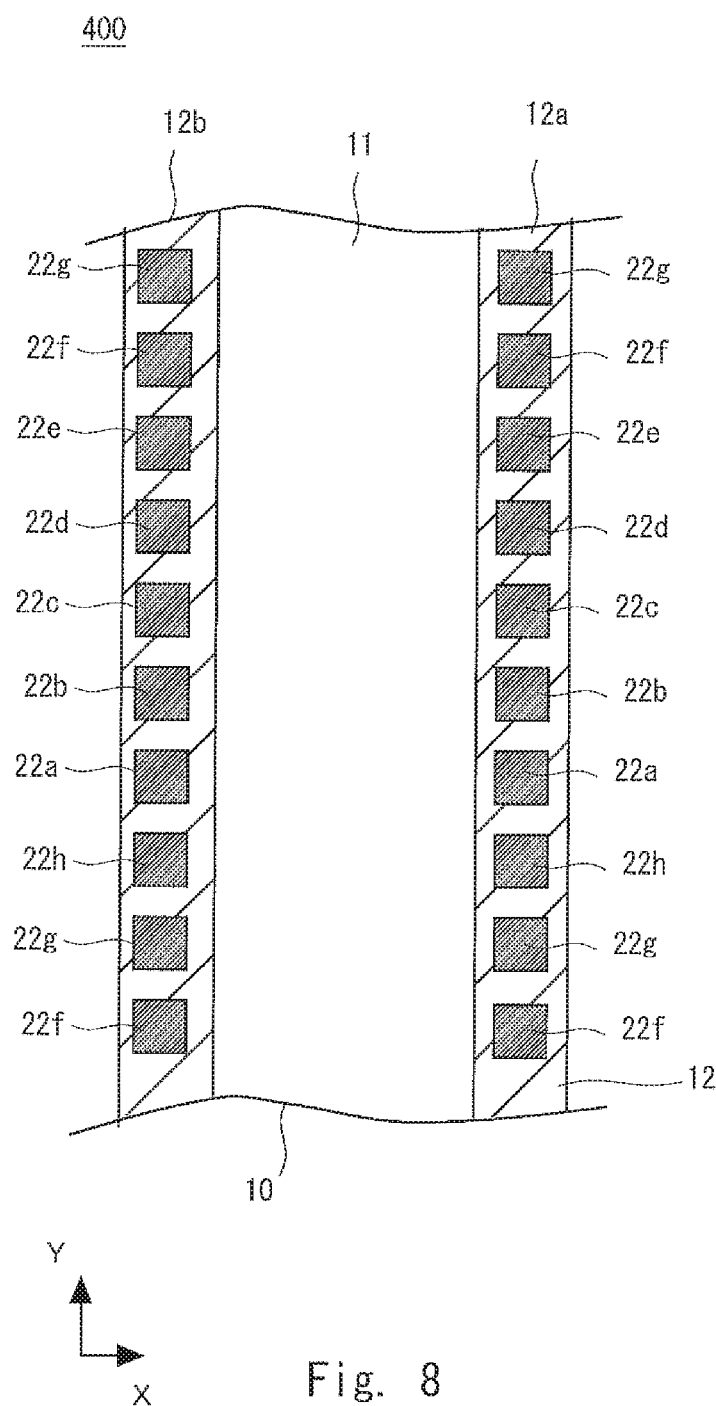
FIG. 8 is a plane view illustrating a structure of an intermediate structure unit according to a fourth embodiment.
Figure 9:
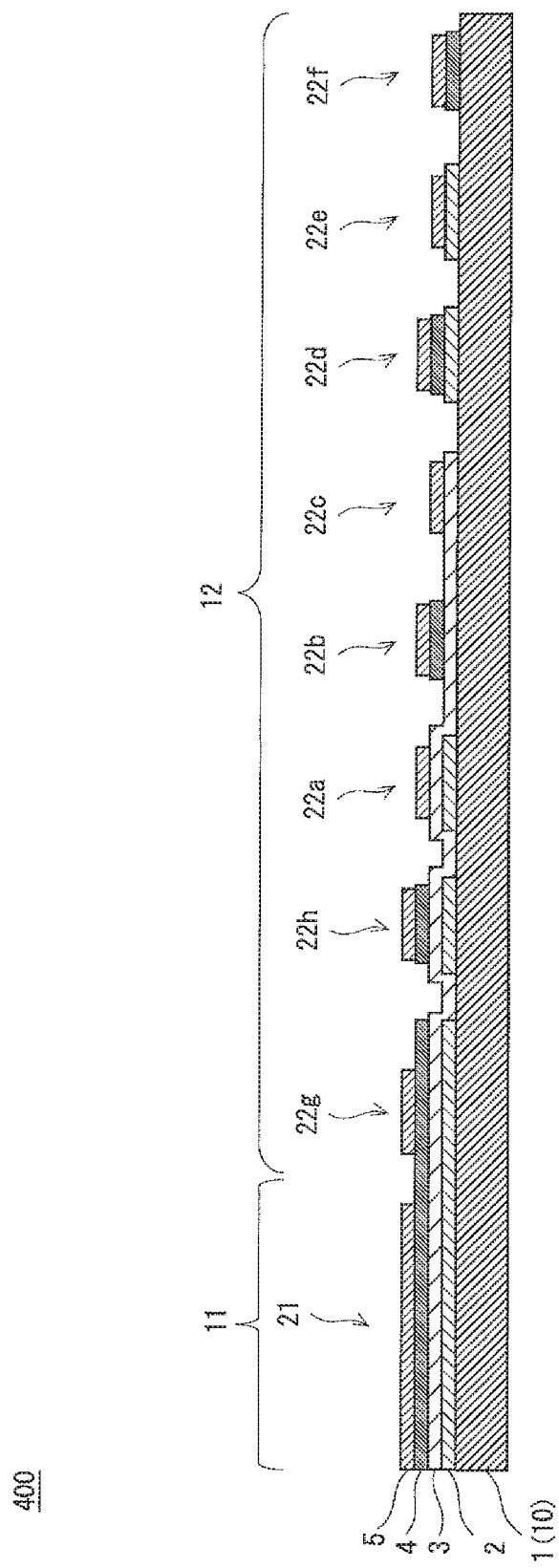
FIG. 9 is a sectional view illustrating the structure of the intermediate structure unit according to the fourth embodiment.

Structure of an intermediate structure unit 400 for a cell according to the present embodiment will be described with reference to FIGS. 8 and 9. FIG. 8 is a plane view schematically illustrating the structure of the intermediate structure unit 400 and FIG. 9 is a sectional view thereof.

In the fourth embodiment, an elongated belt-shaped conductive sheet is used as the substrate 10. Specifically, as illustrated in FIG. 8, the belt-shaped conductive sheet, a longitudinal direction of which is oriented in Y-direction and a latitudinal direction (width direction) of which is oriented in X-direction, is used as the substrate 10. Here, the conductive substrate 10 doubles with the first electrode layer 1. That is, the substrate 10 functions as the first electrode layer 1. Accordingly, the substrate 10 is to be connected to a probe or a terminal during evaluation and charging-discharging.

As illustrated in FIG. 8, the cell forming region 11 is a belt-shaped region, the longitudinal direction of which is oriented in Y-direction. The test structure unit forming region 12 is arranged on each side of the belt-shaped cell forming region 11. That is, the test structure unit forming region 12 is arranged respectively on +X side and −X side of the cell forming region 11. In FIG. 8, the test structure unit forming region 12 on +X side is illustrated as a test structure unit forming region 12a and the test structure unit forming region 12 on −X side is illustrated as a test structure unit forming region 12b.

A plurality of test structure units 22 are arranged along Y-direction at each of the test structure unit forming regions 12a, 12b. For example, a plurality of test structure units 22a to 22h are arranged in line along Y-direction at the test structure unit forming region 12a on +X side. Similarly, a plurality of test structure units 22a to 22h are arranged in line along Y-direction at the test structure unit forming region 12b on −X side.

At each of the test structure unit forming regions 12a, 12b, the test structure unit 22a, the test structure unit 22b, the test structure unit 22c, the test structure unit 22d, the test structure unit 22e, the test structure unit 22f, the test structure unit 22g, and the test structure unit 22h are sequentially arranged. That is, different kinds of the test structure units 22a to 22h are arranged sequentially in Y-direction.

Further, at the test structure unit forming regions 12a, 12b on both sides, the same kinds of the test structure units 22 are arranged at the same position in Y-direction. For example, the test structure unit 22a at the test structure unit forming region 12a is at the position in Y-direction of the test structure unit 22a at the test structure unit forming region 12b. Similarly, regarding the test structure units 22b to 22h, the positions in Y-direction for the same kind thereof are matched in the test structure unit forming region 12a and the test structure unit forming region 12b.

As illustrated in FIG. 8, the cell forming region 11 is elongated in Y-direction. The test structure units 22 arranged on both sides of a position where the evaluated cell 21 exists are to be evaluated. For example, the test structure units 22 at the vicinity of a position in Y-direction where a failure occurs with performance evaluation of the cell 21 are to be evaluated. According to the above, appropriate evaluation can be performed. Thus, it is possible to obtain effects similar to the first embodiment. Here, the normal cell 21 is separated from the test structure unit forming regions 12a, 12b on both sides thereof.

In FIG. 8, the test structure unit forming regions 12a, 12b are arranged on both sides of the cell forming regions 11. However, it is also possible to arrange the test structure unit forming region 12 only on one side of the cell forming region 11. That is, in FIG. 8, only the test structure unit forming region 12a on +X side may be arranged. In this case, eliminating and separating the test structure unit forming region 12 can be easily performed.

Further, in the example of the fourth embodiment, all the layers of the cells 21 are continuously formed in Y-direction. However, the second electrode layers 5 may be formed intermittently as being separated in Y-direction. Further, the second electrode layers 5 and the p-type semiconductor layers 4 may be formed intermittently as being separated in Y-direction. In such cases, a failed position of the cell 21 can be easily specified and the test structure unit 22 to be used for evaluation can be easily selected. Further, in a case that a failure is detected at a part of the cell 21, the intermediate structure unit 400 may be cut in X-direction to eliminate the failed part.

In the first to fourth embodiments described above, both of the equivalently-layered test structure units and the layer-missed test structure units are arranged. However, it is also possible that only the layer-missed structure units are arranged.

In the above description, the n-type semiconductor layer 2, the charging layer 3, and the p-type semiconductor layer 4 are arranged between the electrode layers of the cell 21. However, it is also possible that a layer other than the n-type semiconductor layer 2, the charging layer 3, and the p-type semiconductor layer 4 is arranged. In such a case as well, it is preferable that the layer at a part between the electrode layers of the cell 21 is formed in the test structure unit 22. According to the above, the added functional layer can be evaluated.

The embodiments of the present invention are described in the above. Here, the present invention includes appropriate modifications thereof without departing from the object and effects thereof and is not limited to the abovementioned embodiments.

This application is based upon and claims the benefit of priority from Japanese patent application No. 2015-144556, filed on Jul. 22, 2015, the disclosure of which is incorporated herein in its entirety by reference.

REFERENCE SIGNS LIST

1 First electrode layer
2 n-type semiconductor layer
3 Charging layer
4 p-type semiconductor layer
5 Second electrode layer
10 Substrate
11 Cell forming region
12 Test structure unit forming region
21 Cell
22 Test structure unit
31 Cell
32 Test structure unit

The invention claimed is:

1. An intermediate structure unit for a secondary cell, comprising one or more secondary cells and one or more test structure units, arranged on a common substrate, wherein each of the secondary cell and the test structure unit includes a first electrode layer and a second electrode layer, the first electrode layers are formed in an integrated pattern for the secondary cell and the test structure unit, the second electrode layers are separated between the secondary cell and the test structure unit, a plurality of layers are layered at the secondary cell between the first electrode layer and the second electrode layer, the plurality of layers includes at least a metal oxide semiconductor layer and a charging layer, and wherein there are fewer layers between the first electrode layer and the second electrode layer of the test structure unit in comparison to the secondary cell.

2. The intermediate structure unit for the secondary cell according to claim 1, including a plurality of the test structure units, wherein the second electrode layers are separated between the test structure units.

3. The intermediate structure unit for the secondary cell according to claim 2, wherein the plurality of the test structure units includes a test structure unit in which the charging layer is not formed between the fist electrode layer and the second electrode layer.

4. The intermediate structure unit for the secondary cell according to claim 2, wherein the plurality of the test structure units includes a test structure unit in which the charging layer between the first electrode layer and the second electrode layer is in contact with at least one of the first electrode layer and the second electrode layer.

5. The intermediate structure unit for the secondary cell according to claim 2, wherein the second electrode layers of the plurality of the test structure units are equally shaped in a plane view.

6. The intermediate structure unit for the secondary cell according to claim 2, wherein some units of the plurality of the test structure units are arranged as being adjacent to a single secondary cell.

7. The intermediate structure unit for the secondary cell according to claim 2, wherein the plurality of the test structure units include test structure units, layer structures of which, each arranged between the first electrode layer and the second electrode layer, are different from each other.

8. The intermediate structure unit for the secondary cell according to claim 7, wherein the secondary cell has a layer structure layered between the first electrode layer and the second electrode layer, the layer structure being a two-layer structure having the metal oxide semiconductor layer and the charging layer, the plurality of the test structure units include a test structure unit in which the charging layer is arranged between the first electrode layer and the second electrode layer, and a test structure unit in which the metal oxide semiconductor layer is arranged between the first electrode layer and the second electrode layer.

9. The intermediate structure unit for the secondary cell according to claim 7, wherein the metal oxide semiconductor layer includes a first metal oxide semiconductor layer and a second metal oxide semiconductor layer that are different from each other, the first metal oxide semiconductor layer, the charging layer, and the second metal oxide semiconductor layer are arranged at the secondary cell between the first electrode layer and the second electrode layer, and the plurality of the test structure units include a test structure unit in which the first metal oxide semiconductor layer and the charging layer are arranged between the first electrode layer and the second electrode layer, a test structure unit in which the charging layer and the second metal oxide semiconductor layer are arranged between the first electrode layer and the second electrode layer, a test structure unit in which the charging layer is arranged between the first electrode layer and the second electrode layer, a test structure unit in which the first metal oxide semiconductor layer and the second metal oxide semiconductor layer are arranged between the first electrode layer and the second electrode layer, a test structure unit in which the first metal oxide semiconductor layer is arranged between the first electrode layer and the second electrode layer, and a test structure unit in which the second metal oxide semiconductor layer is arranged between the first electrode layer and the second electrode layer.

10. The intermediate structure unit for the secondary cell according to claim 2, wherein the secondary cell and the test structure unit are arranged on both faces of the substrate.

11. The intermediate structure unit for the secondary cell according to claim 2, wherein the test structure units further include a test structure unit in which the same layer structure as a layer structure layered at the secondary cell between the first electrode layer and the second electrode layer is formed between the first electrode layer and the second electrode layer.

12. The intermediate structure unit for the secondary cell according to claim 1, wherein the substrate is conductive and doubles with the first electrode layer.

13. A method for manufacturing a secondary cell, comprising:
preparing the intermediate structure unit for the secondary cell according to claim 1, and measuring electrical characteristics of the test structure unit.

14. The method for manufacturing the secondary cell according to claim 13, further comprising evaluating performance of the secondary cell arranged in the intermediate structure unit for the secondary cell, wherein the measuring electrical characteristics of the test structure unit is performed in a case that the performance of the secondary cell does not satisfy predetermined criteria.

15. The method for manufacturing the secondary cell according to claim 14, further comprising separating the test structure unit from the secondary cell in a case that the performance of the secondary cell satisfies the predetermined criteria.

* * * * *